(12) United States Patent
Magoon et al.

(10) Patent No.: US 7,095,801 B1
(45) Date of Patent: Aug. 22, 2006

(54) PHASE ADJUSTABLE POLYPHASE FILTERS

(75) Inventors: Rahul Magoon, Irvine, CA (US); Alyosha C. Molnar, Costa Mesa, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 742 days.

(21) Appl. No.: 09/823,299

(22) Filed: Mar. 30, 2001

(51) Int. Cl.
*H04L 27/12* (2006.01)
*H04L 27/20* (2006.01)
*H03H 11/16* (2006.01)

(52) U.S. Cl. .................. 375/302; 375/296; 327/244
(58) Field of Classification Search ................ 375/144, 375/296, 298, 302, 319, 325; 455/110, 325; 327/231, 236–238, 244
See application file for complete search history.

(56) References Cited

U.S. PATENT DOCUMENTS

| | | | | |
|---|---|---|---|---|
| 3,614,475 | A * | 10/1971 | Deboo | 327/244 |
| 4,110,707 | A * | 8/1978 | Giolma et al. | 332/127 |
| 4,275,345 | A * | 6/1981 | Tait | 323/363 |
| 4,476,585 | A * | 10/1984 | Reed | 455/207 |
| 4,638,190 | A * | 1/1987 | Hwang et al. | 327/237 |
| 4,677,431 | A * | 6/1987 | Lee | 345/24 |
| 4,908,532 | A * | 3/1990 | Chadwick | 327/236 |
| 5,313,173 | A * | 5/1994 | Lampe | 332/103 |
| 5,341,107 | A * | 8/1994 | Bijker et al. | 329/337 |
| 5,489,878 | A * | 2/1996 | Gilbert | 331/57 |
| 5,504,785 | A * | 4/1996 | Becker et al. | 375/344 |
| 5,608,796 | A * | 3/1997 | Banu et al. | 379/403 |
| 5,612,975 | A * | 3/1997 | Becker et al. | 375/319 |
| 5,864,586 | A * | 1/1999 | Kato | 375/297 |
| 5,870,670 | A * | 2/1999 | Ripley et al. | 455/304 |
| 5,929,704 | A * | 7/1999 | Proctor et al. | 330/149 |
| 6,133,964 | A * | 10/2000 | Han | 348/726 |
| 6,240,142 | B1 * | 5/2001 | Kaufman et al. | 375/261 |
| 6,275,544 | B1 * | 8/2001 | Aiello et al. | 375/326 |
| 6,310,502 | B1 * | 10/2001 | Klier | 327/231 |
| 6,310,925 | B1 * | 10/2001 | Kitta | 375/326 |
| 6,313,680 | B1 * | 11/2001 | Havens et al. | 327/244 |
| 6,317,589 | B1 * | 11/2001 | Nash | 455/245.2 |
| 6,330,290 | B1 * | 12/2001 | Glas | 375/324 |
| 6,353,359 | B1 * | 3/2002 | Leizerovich | 330/2 |
| 6,384,681 | B1 * | 5/2002 | Bonds | 330/149 |
| 6,404,293 | B1 * | 6/2002 | Darabi et al. | 331/37 |
| 6,427,068 | B1 * | 7/2002 | Suominen | 455/302 |
| 6,441,682 | B1 * | 8/2002 | Vinn et al. | 327/552 |
| 6,603,391 | B1 * | 8/2003 | Greeff et al. | 340/10.3 |
| 6,606,483 | B1 * | 8/2003 | Baker et al. | 455/126 |
| 6,621,876 | B1 * | 9/2003 | Camp et al. | 375/296 |

(Continued)

OTHER PUBLICATIONS

Boveda et al., A.0.7-3 GHz GaAs QPSK/QAM Direct Modulator, Dec. 1993, Solid State Circuits, IEEE Journal of, vol. 28, Issue 12, pp. 1340-1349.*

*Primary Examiner*—Emmanuel Bayard
*Assistant Examiner*—Lawrence B. Williams
(74) *Attorney, Agent, or Firm*—Thomas, Kayden, Horstemeyer & Risley, LLP

(57) ABSTRACT

A polyphase filter for wireless communication systems includes at least two phase splitting filters each having a variable resistance across their respective outputs. The variable resistance can take any suitable form, such as a MOS transistor biased in the linear (triode) region, a bipolar differential pair, or a digitally switchable resistance. The phase adjustment required for a particular filter can be identified and adjusted through either a closed loop system or an open loop system. Adjustment of the variable resistance reduces quadrature error.

27 Claims, 7 Drawing Sheets

U.S. PATENT DOCUMENTS 6,658,066 B1 * 12/2003 Magoon et al. ............. 375/298
6,707,863 B1 * 3/2004 Mrozek et al. ............. 375/327
2002/0122467 A1 * 9/2002 Camp et al. ................ 375/144
2002/0171497 A1 * 11/2002 Forbes ........................ 331/57

* cited by examiner

PHASE ADJUSTABLE POLYPHASE FILTERS

BACKGROUND OF THE INVENTION

1. Field of the Invention

This invention relates to polyphase filters for wireless communication systems, and more particularly, to polyphase filters having adjustable phase for obtaining accurate quadrature in digital cellular telephone systems.

2. Related Art.

Modern wireless communication systems such as digital cellular telephone systems send and receive signals by encoding and decoding information on a radio frequency carrier with phase components that can be mapped on an I-Q plane. Such systems need high-accuracy phase splitters to produce accurate quadrature for modulation in radio transmitters. High accuracy phase splitters are also needed for demodulation in radio receivers. Such phase splitting is often accomplished through the use of polyphase filters.

Many polyphase filters only produce an accurate phase split over a narrow frequency range, and even polyphase filters with wide-band phase splitting characteristics are only as accurate as the matching of the electrical parameters of their passive components. Good matching requires devices that are large in size in the context of cellular telephones, for example, and suffer from increased parasitic losses that degrade noise performance and consume more power, shortening already limited battery life. Furthermore, other circuits in the radio receiver besides the phase splitter itself can alter the phase and introduce errors in quadrature. Such errors are typically small (on the order of 5 degrees), but industry requirements are on the order of 2 to 3 degrees or less, so even small errors can present a problem.

SUMMARY

This invention provides polyphase filters that maintain accurate quadrature in communication equipment. The filters have at least two-phase splitters and a variable resistance on an output of at least one phase splitter, and preferably all phase splitter outputs. The variable resistor can take any suitable form, such as a MOS transistor biased in the linear (triode) region, a bipolar differential transistor pair, a digitally switchable resistance, or the like. The phase adjustment required for a particular filter or system can be identified through a calibration process in either a closed loop system or an open loop system, and the phase of each phase splitter can be adjusted accordingly.

The polyphase filter can also include four phase splitters that produce differential outputs. In that case, a variable resistance is provided for one or both differential outputs. While a 90E phase shift is typical, the invention is applicable to systems which use a 45E phase shift or any other phase shift, and of course phase errors in the entire communication device can be corrected using this invention.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWING

The invention can be better understood with reference to the following figures. The components in the figures are not necessarily to scale, emphasis instead being placed upon illustrating the principals of the invention. Moreover, in the figures, like reference numerals designate corresponding parts throughout the different views.

DETAILED DESCRIPTION

Figure 1:
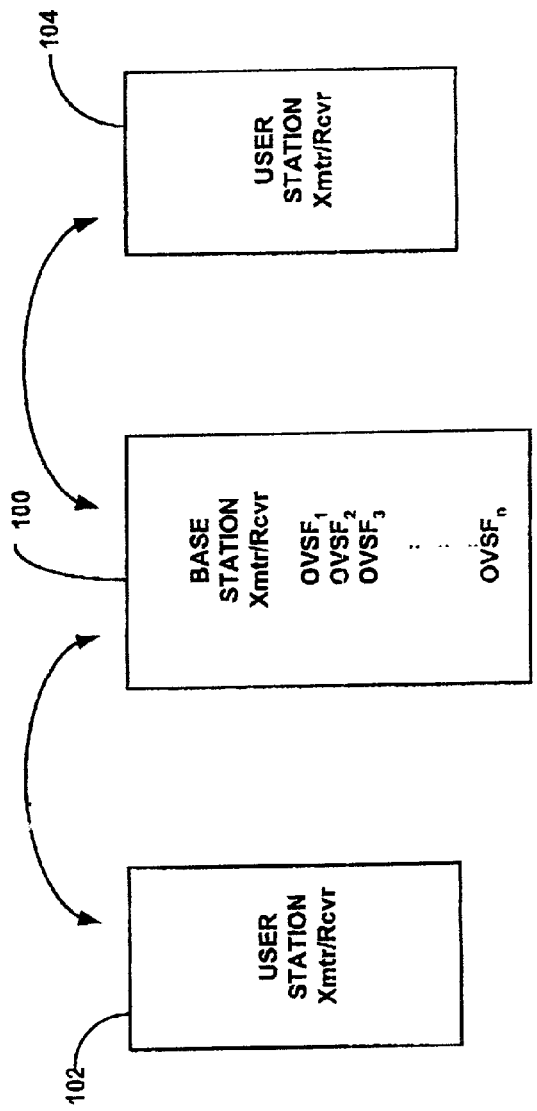
FIG. 1 is a block diagram of a communication system using quadrature phase modulation having phase components on an I-Q plane.

In FIG. 1, a communication system includes at least one base station 100, and at least two user stations 102, 104. The base station and each user station each have a radio frequency transmitter and receiver, and the user stations 102 communicate with the base station 100 over designated radio frequency channels, using phase modulation, by orthogonally encoding the carrier frequency with signal points having phase components on an I-Q plane, shown in FIG. 2.

Figure 2:
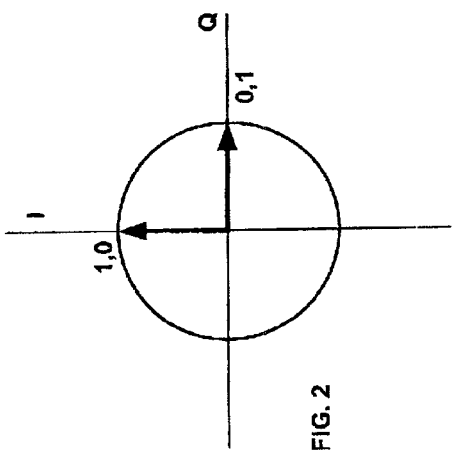
FIG. 2 is a diagram of the I-Q plane used in a quadrature phase modulation system.

The I-Q plane has several signal points, including 1,0 and 0,1 in FIG. 2. In order to be properly decoded, the correct phase difference between the I component and the Q component must be maintained. This phase difference could be 90E or any other suitable phase difference. In the receiver, this phase difference is established using a polyphase filter.

Figure 3:
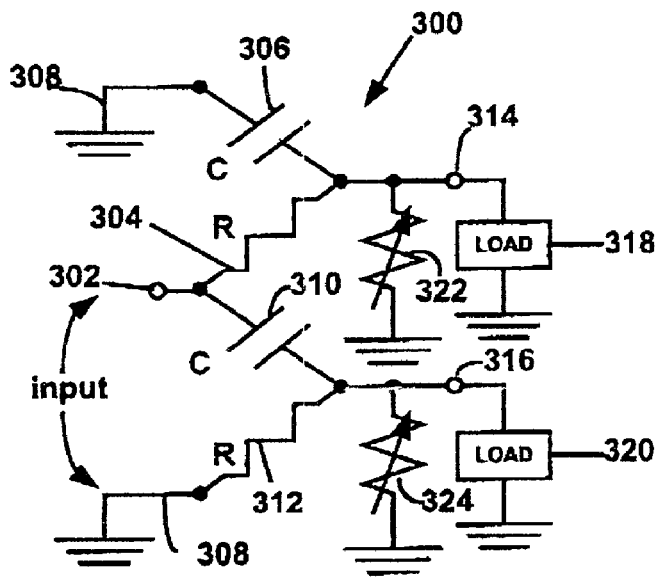
FIG. 3 is a circuit diagram of a polyphase filter having variable resistors for phase adjustment.

In FIG. 3, a polyphase filter 300 having an input terminal 302 includes a resistor 304 and a series capacitor 306 tied to the input terminal 302 on one end and to ground 308 on the other end. A capacitor 310 and series resistor 312 are also tied to the input terminal 302 on one end and ground 308 on the other end. These are single-ended outputs.

Each RC network (304, 306 and 310, 312) splits the phase of an incoming signal, such as a local oscillator tone, so that the phase of the signal at an output port 314 is approximately 90E out of phase with a signal produced at an output port 316. In fact, if all of the respective resistances and capacitances are identical, then the outputs will be exactly 90E out of phase, which is ideal. The unloaded outputs $0_{314}$ and $0_{316}$ at the ports 314, 316, respectively can be expressed as follows:

$$O_{314(UNLOADED)} = \text{input} \frac{1}{1 + j\omega R_{304}C_{306}}$$

-continued $$O_{316(UNLOADED)} = \text{input} \frac{j\omega R_{312}C_{310}}{1 + j\omega R_{312}C_{310}}$$

As seen above, if $R_{304}=R_{312}$ and $C_{306}=C_{310}$, then $O_{314}$ and $O_{316}$ are exactly 90E out of phase with each other. However, if the resistive and capacitive values of the filter are not identical, or if external loads 318, 320 do not have identical impedance characteristics, the outputs will not have ideal phase shifts. In a digital cellular telephone system, for example, unequal phase shifts cause inaccurate quadrature, resulting in poor reception.

In order to compensate for inaccurate quadrature due to unequal phase shifting, a variable resistor 322 is provided between the output 314 and ground, and a variable resistor 324 is provided between the output 316 and ground. The resistors 322, 324 can be adjusted to correct for unequal phase shifting.

The loaded outputs $O_{314}$ and $O_{316}$ can be expressed as follows:

$$O_{314(LOADED)} = \text{input} \frac{(R_{322\_}R_{318})}{(R_{322\_}R_{318}) + R_{304} + j\omega C_{306}R_{304}(R_{322\_}R_{318})}$$

$$O_{316(LOADED)} = \text{input} \frac{j\omega C_{310}R_{312}(R_{324\_}R_{320})}{(R_{324\_}R_{320}) + R_{312} + j\omega C_{310}R_{312}(R_{324\_}R_{320})}$$

By adjusting the resistors $R_{322}$ and $R_{324}$ appropriately, a 90E phase shift can be maintained between $O_{314}$ and $O_{316}$. This adjustment can be made on the fly, as will be seen.

It can be seen in FIG. 3 that the variable resistance can be connected in parallel with the resistor in the phase splitter, as with the variable resistor 324 (connected in parallel with the resistor 312), or the capacitance in the phase splitter, as with the variable resistor 322 (connected in parallel with the capacitor 306). Of course, both variable resistors could be connected across either the resistor or capacitor of their respective phase splitters, if desired. Also, only one variable resistor is necessary to practice the invention, although two variable resistors probably provide more even loading and better symmetry.

Figure 4:
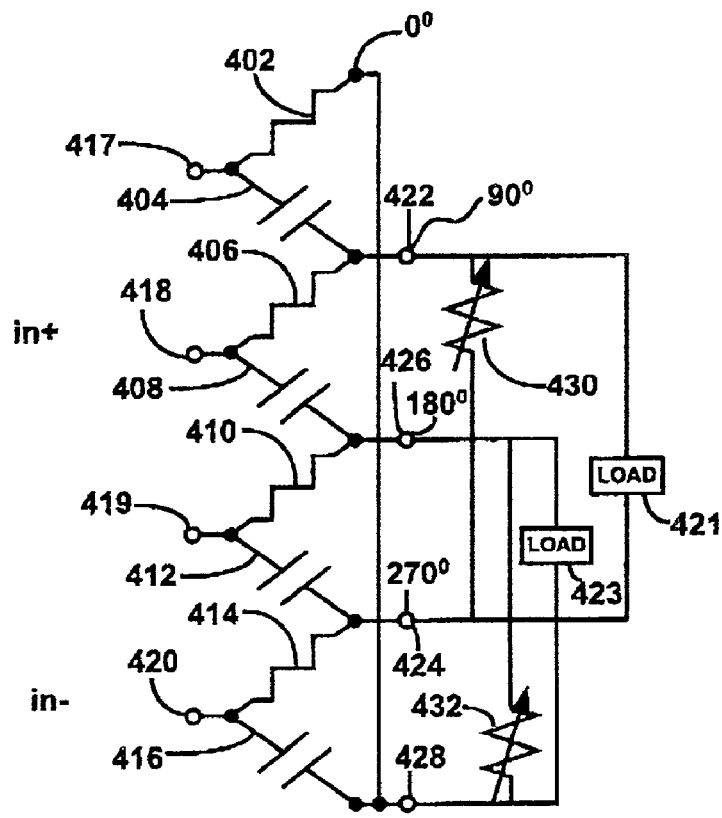
FIG. 4 is a circuit diagram of a differential polyphase filter having variable resistors for phase adjustment.

A differential load phase splitter 400 is shown in FIG. 4. The phase splitter 400 includes a plurality of series RC networks connected to each other in series. The first RC network includes a resistor 402 and a capacitor 404, and the second RC network has a resistor 406 and a capacitor 408. The third RC network includes a resistor 410 and a capacitor 412, and the fourth RC network has a resistor 414 and a capacitor 416.

A differential input 418, 420 is provided. The input 418 is applied between the resistor 406 and the capacitor 408, and the input 420 is applied between the resistor 414 and the capacitor 416 in FIG. 4. Terminals 417 and 419 are at virtual ground potential. The phase splitter 400 produces 0E, 90E, 180E and 270E phase shifts as shown.

The phase splitter 400 provides two differential signals to loads 421, 423 at output terminals 422, 424 and 426, 428, respectively. A variable resistor 430 is connected across the output terminals 422 and 424, and a variable resistor 432 is connected across the output terminals 426 and 428. The phase splitter 400 also produces a 90E phase shift in this configuration, although of course circuits that produce 45E and other phase shifts could also be used with this invention.

Figure 5:
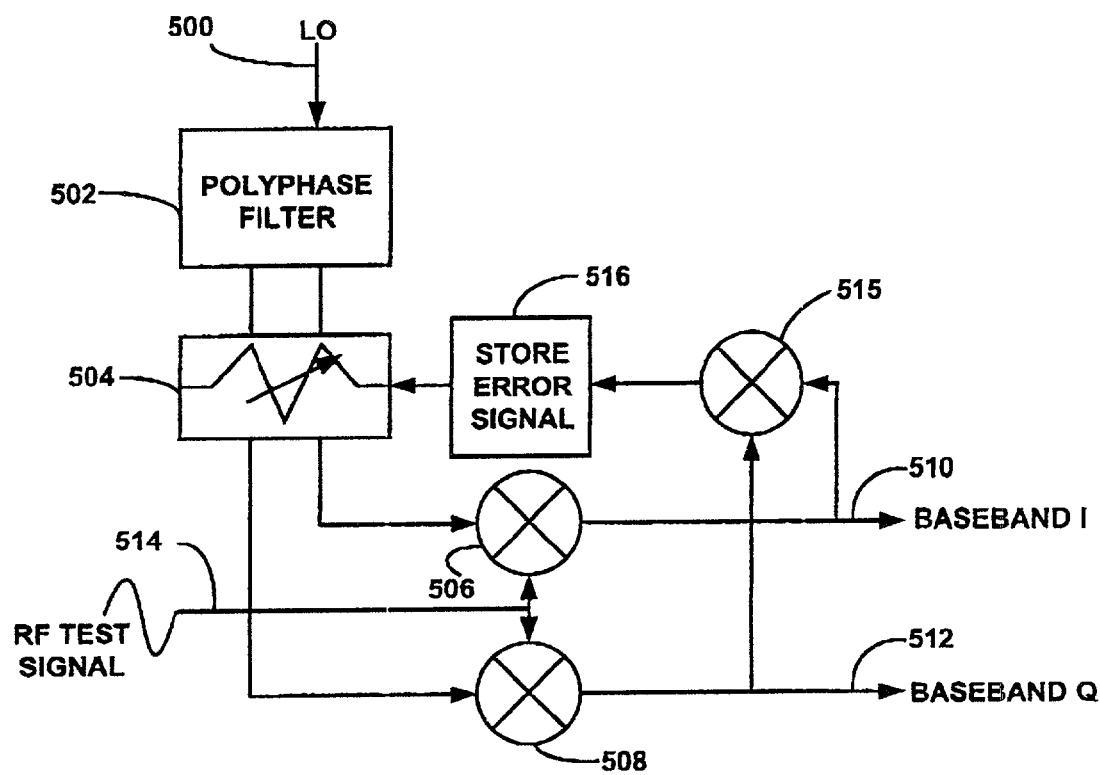
FIG. 5 is a block diagram of phase error detection and correction circuitry in a communication device.

The manner in which the invention is used to correct phase errors is shown in FIG. 5. A local oscillator signal 500 is applied to a polyphase filter 502. At least one variable resistor 504 is provided for phase correction. The output of the resistor is applied to multipliers 506, 508 to produce a Baseband I output 510 and a Baseband Q output 512 when mixed with a coded RF signal. The outputs 510 and 512 are decoded by circuitry that is not shown.

The outputs 510, 512 are also fed back to a phase detector 515 that measures any undesired difference in the relative phases of the outputs 510, 512. The phase difference is measured when a test RF signal 514 is applied to the multipliers 506, 508. The phase difference is stored in an error signal memory 516 until the test RF signal 514 is applied again. The test RF signal can be generated internally by a switched tone generator or the like, or it could be contained in a signal received through an antenna.

The test signal can be applied as often as desired. In time division multiple access (TDMA) systems, for example, actual transmission/reception only occurs about 12% of the time, so phase measurements can easily be made between transmissions/receptions.

Figure 6:
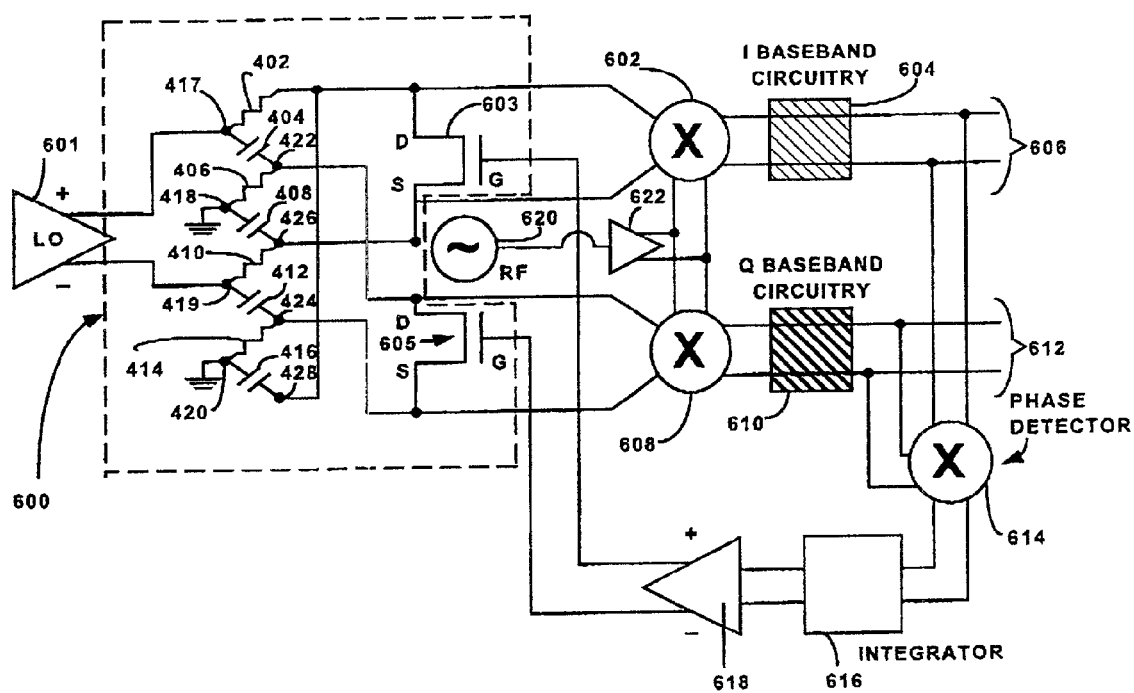
FIG. 6 is a diagram of a closed loop phase error detection and correction system in a communication device, using a MOSFET as a variable resistor.

A phase splitter 600 is shown in a closed loop system for phase correction in FIG. 6. The phase splitter 600 is similar to the phase splitter 400, as will be seen. In this embodiment, the output of a local oscillator 601 is connected to input terminals 417, 419 and variable resistors 603, 605 are connected across the terminals 428, 426 and 422, 424, respectively.

In this embodiment, the resistors 603, 605 are MOS transistor devices. The drain and source of the transistor 603 are connected across terminals 428, 426, and the drain and source of the transistor 605 are connected across terminals 422, 424.

The output terminals 428, 426 represent the I quadrature, and are processed through a mixer 602 and baseband circuitry 604, to an output 606. Similarly, the output terminals 422, 424 represent the Q quadrature signals, and they are processed through a mixer 608 and baseband circuitry 610 to an output 612.

In this embodiment, the resistors 603, 605 are MOS transistor devices. The drain and source of the transistor 603 are connected across terminals 428, 426, and the drain and source of the transistor 605 are connected across terminals 422, 426.

The output terminals 428, 426 represent the I quadrature, and are processed through a mixer 602 and baseband circuitry 604, to an output 606. Similarly, the output terminals 422, 426 represent the Q quadrature signals, and they are processed through a mixer 608 and baseband circuitry 610 to an output 612.

A phase detector 614 compares the outputs 606 and 612. The output of the phase detector 614 is integrated at 616, and the output of the integrator 616 is processed in a differential amplifier 618. The positive output of the differential amplifier 618 provides the gate signal for the variable resistor 603, and the negative output of the differential amplifier 618 provides the gate signal for the variable resistor 605.

A test RF signal source 620 inputs a carrier to the mixers 602, 608, through an amplifier 622. The RF signal is typically a digital cellular telephone or other communication signal, or an internal tone generator, as previously described. The multiplier 602 produces the I quadrature signal by multiplying the RF input signal with the in phase local oscillator signal, and the mixer 608 produces the Q quadrature signal by multiplying the RF input signal by the quadrature phase local oscillator signal. The transistors 603, 605 preferably operate in their linear range. The effective resistance of the transistors is determined by the differential amplifier 618.

Figure 7:
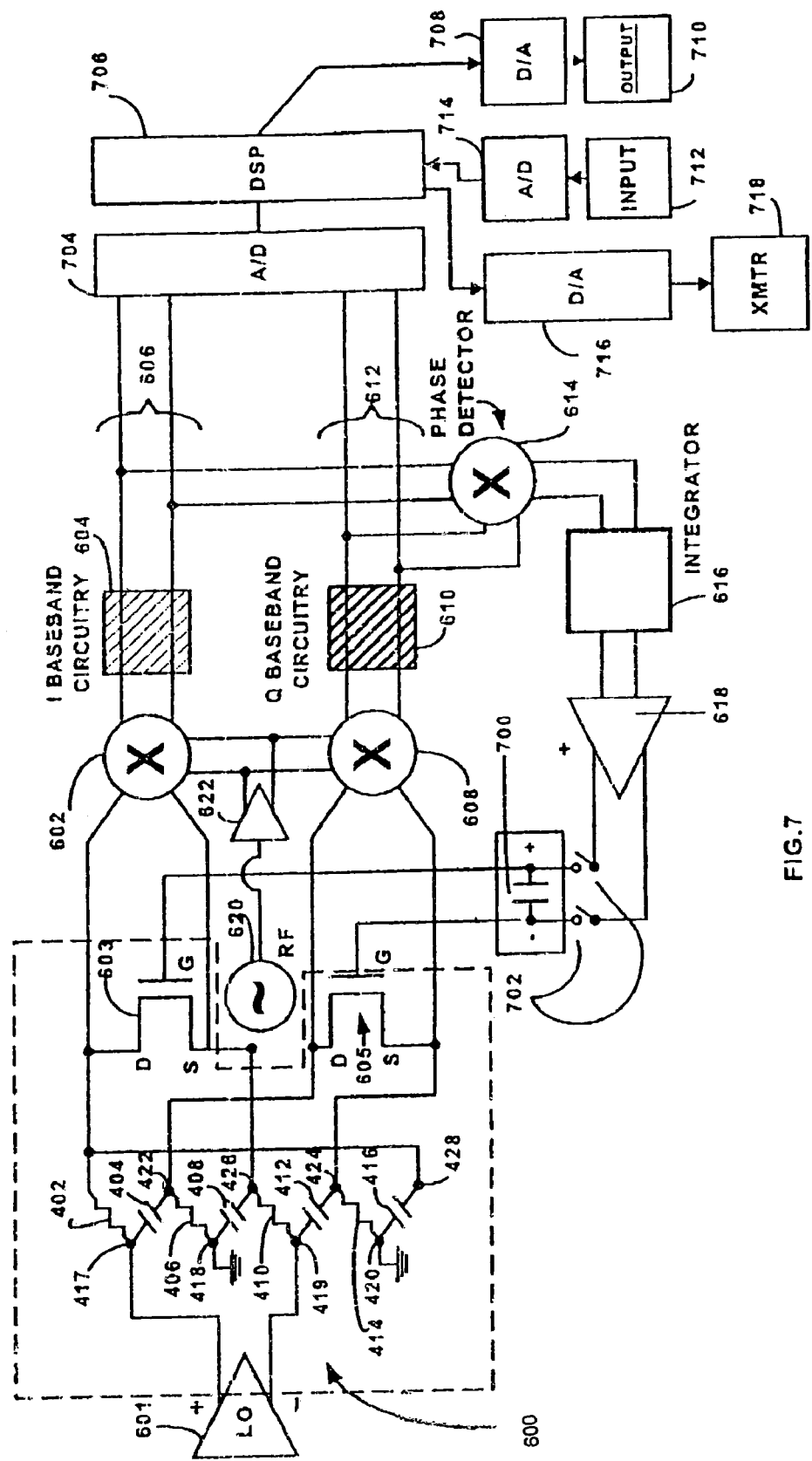
FIG. 7 is a diagram of a communication device having an open loop phase error detection and correction system, using a MOSFET as a variable resistor.

A phase splitter 600 is shown in an open loop system for phase correction in FIG. 7. This embodiment is similar to the closed loop system of FIG. 6, but a storage device such as a capacitor 700 bridges the positive and negative outputs of the differential amplifier 618.

The capacitor 700 stores a charge when switches 702 are closed, and holds the charge when the switches 702 are opened. In this manner, the system operates in a closed loop to calibrate, and an open loop during operation. The switches 702 can be controlled fairly independently, and can be closed at periodic time intervals, when temperatures change sufficiently, etc.

This invention is typically sold as part of an integrated circuit chip or chip set. In the open loop system of FIG. 7, for example, such a chip set might also include an analog to digital converter 704 which converts the I and Q baseband outputs 606, 612 to digital signals, a digital signal processor (DSP) 706 of known design, and a digital to analog converter 708 that produces an output 710 for analog signals. The digital output of the DSP 706 could be the output, as well. In all, these circuits generally complete the receiver circuitry. The chip set can also include circuitry for transmitting signals, including an input circuit 712, such as a microphone or keyboard, an analog to digital converter 714 that feeds a digital signal to the DSP 706, a digital to analog converter 716 and an RF signal generator 718 that produces and transmits the modulated signal.

Figure 8:
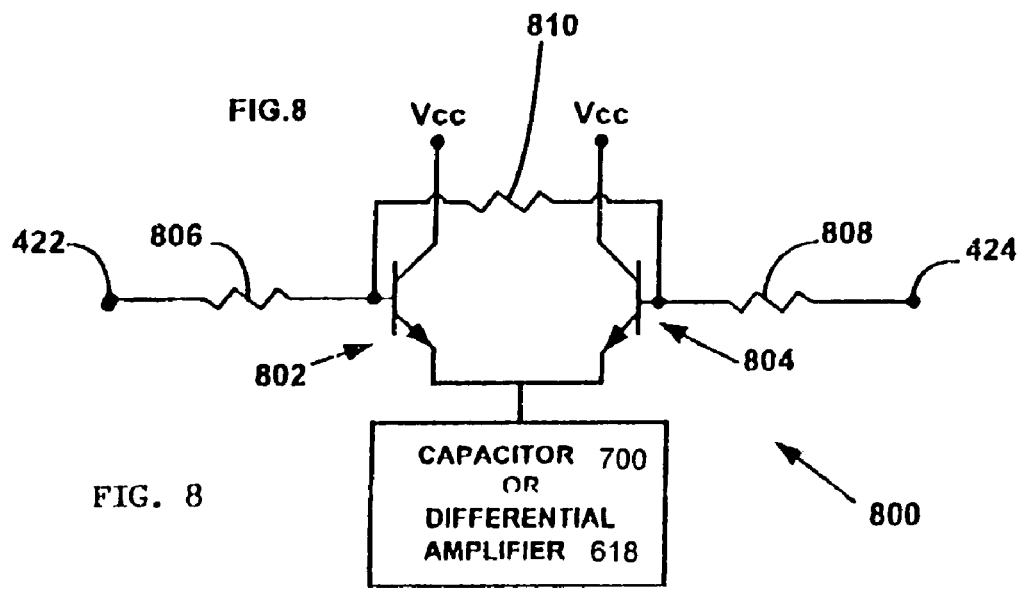
FIG. 8 is a circuit diagram of a variable resistance circuit that uses a bipolar differential pair of transistors.

FIGS. 6 and 7 show circuits in which the variable resistor is a MOS transistor such as a MOSFET, but various other configurations could be used. FIG. 8 shows a variable resistor 800 that includes a bipolar differential pair of transistors 802, 804 having their collectors connected to a power source Vcc and their emitters connected to the capacitor 700 in FIG. 7, the differential amplifier 618 in FIG. 6, or any other suitable bias adjustment device. The base of transistor 802 is connected to a terminal of a phase splitting filter (such as terminal 422 in FIG. 4) through a resistor 806. The base of transistor 804 is connected to another terminal of a phase splitter (such as terminal 424 in FIG. 4) through a resistor 808. The bases 806, 808 are also connected to each other by a resistor 810. Changes in the voltage at the emitters cause changes in the effective resistance across the terminals 422, 424.

Figure 9:
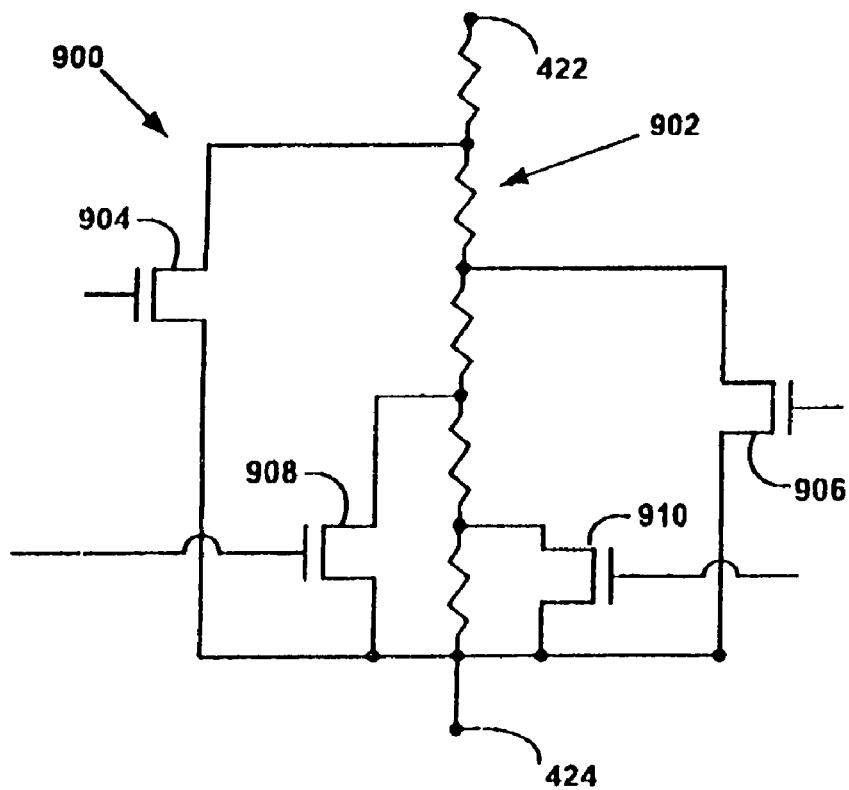
FIG. 9 is a circuit diagram of a variable resistance circuit that is digitally switchable.

FIG. 9 shows a variable resistor 900 that is digitally controlled. The variable resistor 900 includes a resistor 902 which is tapped at several points by transistors 904, 906, 908 and 910, to change the total resistance across terminals 422, 424 or the like. By selectively turning the transistors 904, 906, 908 and 910 on and off by controlling the transistor gates (through circuitry not shown), the resistance across terminals 422, 424 can be adjusted.

Figure 10:
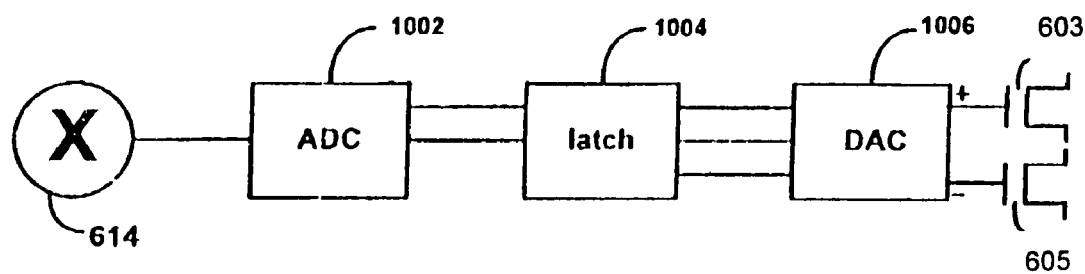
FIG. 10 is a block diagram of a digitally controlled variable resistance circuit.

An analog-to-digital converter (ADC) 1002, a latch 1004, and a digital-to-analog converter (DAC) 1006 could be used instead of the integrator 616, differential amplifier 618 and capacitor 700 in FIG. 7, if desired, as seen in FIG. 10. The analog to digital converter 1002 is connected to the phase detector 614, and the latch 1004 stores the digital value determined by the ADC 1002. The analog output of the DAC 1006 is fed to the variable resistors 603, 605 in FIG. 7. Generally, digital storage is well suited for power on and reset processes in Time Division Multiple Access (TDMA) systems.

In operation, an RF test signal from the source 514 (FIG. 5) is mixed with the local oscillator signal 500 in mixers 506, 508, to produce a baseband or intermediate frequency (IF) signal having I and Q components 510, 512. The phase of the I and Q components is detected in the phase detector 515, and if the phase difference is not 90□, the error signal is stored in memory 516, which adjusts the variable resistors 504 to adjust their effective resistance. In FIGS. 6 and 7, for example, the transistors 603, 605 are biased in their linear or triode range, so that even small changes at their gates produce effective resistance changes across their drains and sources, slightly adjusting the phases of the I and Q signals from the local oscillator 500. After phase adjustments, a RF carrier signal encoded with a voice communication, data communication or the like is mixed with the phase adjusted local oscillator signals and decoded.

While the various embodiments of the application have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A polyphase filter, comprising:
   a first phase splitting filter comprising a first RC network, the first phase splitting filter configured to provide a first output;
   a second phase splitting filter comprising a second RC network, the second phase splitting filter configured to provide a second output;
   a first variable resistance separate from the first RC network and the second RC network, the first variable resistance connected across the first output; and
   circuitry capable of detecting the phase of the outputs produced by the first and second outputs, and circuitry capable of adjusting the first variable resistance to produce a desired phase difference between the first output and the second output.

2. The filter of claim 1, wherein the first output and the second output are single-ended outputs.

3. The filter of claim 1, wherein the first and the second outputs are differential outputs.

4. The filter of claim 1, comprising a second variable resistance separate from the first RC network and the second RC network and connected across the second output.

5. The filter of claim 4, wherein the first variable resistance and the second variable resistance include transistors.

6. The filter of claim 5, wherein the transistors include at least one MOSFET transistor operated in the linear range.

7. The filter of claim 4, wherein the first variable resistance and the second variable resistance include a bipolar differential pair.

8. The filter of claim 4, wherein the first variable resistance and the second variable resistance include a digitally switchable resistance.

9. The filter of claim 1, wherein the circuitry capable of detecting the phase of the outputs includes a phase detector, an integrator and a differential amplifier.

10. The filter of claim 1, wherein the circuitry capable of detecting the phase of the outputs includes a phase detector, an integrator, a differential amplifier, a capacitor and a controller for selectively storing and holding the output of the differential amplifier in the capacitor.

11. The filter of claim 1, wherein a local oscillator provides a fixed frequency signal to inputs of the first phase splitting filter and the second phase splitting filter, an RF test signal source provides a test signal which is mixed with the first output and the second output to produce an I-based band signal and a Q-based band signal, the circuitry capable of detecting the phase of the outputs including a phase detector which detects phase differences between the I-based band signal and the Q-based band signal, and an integrator, and the circuitry capable of adjusting the first variable resistance includes a differential amplifier having an input connected to the output of the integrator, the differential amplifier producing an output to the first variable resistance.

12. The filter of claim 1, wherein a local oscillator provides a fixed frequency signal to inputs of the first phase splitting filter and the second phase splitting filter, an RF test signal source provides a test signal which is mixed with the first output and the second output to produce a first baseband signal and a second baseband signal, the circuitry capable of detecting the phase of the outputs includes a phase detector which detects phase differences between the first baseband signal and a second baseband signal, and an integrator, and the circuitry capable of adjusting the first variable resistance includes a differential amplifier having an input connected to the output of the integrator, the differential amplifier producing an output to the first variable resistance when a switch is closed, the differential amplifier output being stored in a capacitor that provides the differential amplifier output to the first variable resistance when the switch is open.

13. A polyphase filter, comprising:
a first phase splitting filter that produces a first output, the first phase splitting filter comprising a first RC network;
a second phase splitting filter that produces a second output, the second phase splitting filter comprising a second RC network;
a first variable resistance connected across the first output and a second variable resistance connected across the second output, the first variable resistance separate from the first RC network and the second variable resistance separate from the second RC network; and
a detector that determines the phase of the first and second outputs, and adjusts the first variable resistance and the second variable resistance to produce a desired phase difference between the first output and the second output.

14. The filter of claim 13, wherein the first output and the second output are single-ended outputs.

15. The filter of claim 13, wherein the first and the second outputs are differential outputs.

16. The filter of claim 13, wherein the first variable resistance and the second variable resistance include transistors.

17. The filter of claim 16, wherein the transistors include at least one MOSFET transistor operated in the linear range.

18. The filter of claim 13, wherein the first variable resistance and the second variable resistance include a bipolar differential pair.

19. The filter of claim 13, wherein the first variable resistance and the second variable resistance include a digitally switchable resistance.

20. The filter of claim 13, wherein the detector includes a phase detector, an integrator and a differential amplifier.

21. The filter of claim 13, wherein the detector includes a phase detector, an integrator, a differential amplifier, a capacitor and a controller for selectively storing and holding the output of the differential amplifier in the capacitor.

22. The filter of claim 13, wherein a local oscillator provides a fixed frequency signal to inputs of the first phase splitting filter and the second phase splitting filter, and an RF test signal source provides a test signal that is mixed with the first output and the second output to produce an I-baseband signal and a Q-baseband signal, the detector including a phase detector which detects phase differences between the I-based band signal and the Q-baseband signal, and an integrator, and the detector further including a differential amplifier having an input connected to the output of the integrator, the differential amplifier producing an output to the first variable resistance and the second variable resistance.

23. The filter of claim 13, wherein a local oscillator provides a fixed frequency signal to inputs of the first phase splitting filter and the second phase splitting filter, and an RF test signal source provides a test signal that is mixed with the first output and the second output to produce a first baseband signal and a second baseband signal, the detector including a phase detector that detects phase differences between the first baseband signal and a second baseband signal, and an integrator, the detector further including a differential amplifier having an input connected to an output of the integrator, the differential amplifier producing an output to the first variable resistance when a switch is closed, the differential amplifier output being stored in a capacitor that stores the differential amplifier output and provides the differential amplifier output to the first variable resistance when the switch is open.

24. A communication system, comprising:
a transmitter and a receiver, the transmitter comprising an input, an analog-to-digital converter, a digital signal processor, a digital-to-analog converter and an RF signal generator, the transmitter modulating an RF carrier with a signal provided to the transmitter input and transmitting the modulated RF carrier, the receiver comprising an RF input, a local oscillator, a polyphase filter connected to an output of the local oscillator, the polyphase filter producing first and second outputs from the local oscillator output, a mixer that combines the RF input with the first and second outputs of the polyphase filter, baseband circuitry, an analog-to-digital converter, and a digital signal processor that demodulates an output of the analog-to-digital converter, and produces a demodulated output,
the polyphase filter including:
a first phase splitting filter comprising a first RC network, the first phase splitting filter configured to provide a first output;
a second phase splitting filter comprising a second RC network, the second phase splitting filter configured to provide a second output;
a first variable resistance separate from the first RC network and the second RC network, the first variable resistance connected across the first output; and
circuitry capable of detecting the phase of the outputs produced by the first and second outputs, and circuitry capable of adjusting the first variable resistance to produce a desired phase difference between the first output and the second output.

25. The system of claim 24, wherein the phase is substantially continuously detected and adjusted in a closed loop manner.

26. The system of claim 24, wherein the phase is adjusted at predetermined times in an open loop manner.

27. A polyphase filter, comprising:
- a first phase splitting filter comprising a first RC network, the first phase splitting filter configured to provide a first output, the first RC network including a first resistor in series connection with a first capacitor, the first resistor and the first capacitor directly connected together at a first node;
- a second phase splitting filter comprising a second RC network, the second phase splitting filter configured to provide a second output, the second RC network including a second resistor in series connection with a second capacitor, the second resistor and the second capacitor directly connected together at a second node;
- a first variable resistance separate from the first RC network and the second RC network, the first variable resistance connected across the first output, the first variable resistance connected to the first node; and
- circuitry capable of detecting the phase of the outputs produced by the first and second outputs, and circuitry capable of adjusting the first variable resistance to produce a desired phase difference between the first output and the second output.

* * * * *